(12) United States Patent
Moriya et al.

(10) Patent No.: US 9,627,184 B2
(45) Date of Patent: Apr. 18, 2017

(54) CLEANING METHOD OF PROCESSING APPARATUS, PROGRAM FOR PERFORMING THE METHOD, AND STORAGE MEDIUM FOR STORING THE PROGRAM

(75) Inventors: Tsuyoshi Moriya, Nirasaki (JP); Hiroyuki Nakayama, Nirasaki (JP); Hiroshi Nagaike, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1397 days.

(21) Appl. No.: 12/960,064

(22) Filed: Dec. 3, 2010

(65) Prior Publication Data
US 2011/0126853 A1 Jun. 2, 2011

Related U.S. Application Data

(63) Continuation-in-part of application No. 11/338,778, filed on Jan. 25, 2006, now abandoned.

(60) Provisional application No. 60/650,956, filed on Feb. 9, 2005.

(30) Foreign Application Priority Data

Jan. 26, 2005 (JP) .................................. 2005-017715

(51) Int. Cl.
 *B08B 7/00* (2006.01)
 *H01J 37/32* (2006.01)

(52) U.S. Cl.
 CPC .... *H01J 37/32862* (2013.01); *H01J 37/3244* (2013.01); *H01J 37/32449* (2013.01)

(58) Field of Classification Search
 None
 See application file for complete search history.

(56) References Cited

U.S. PATENT DOCUMENTS

| | | | |
|---|---|---|---|
| 3,931,789 A | 1/1976 | Kakei et al. | |
| 5,893,962 A | 4/1999 | Mizuno et al. | |
| 5,983,906 A | 11/1999 | Zhao et al. | |
| 6,003,526 A | 12/1999 | Lo et al. | |
| 6,197,116 B1 | 3/2001 | Kosugi | |
| 6,242,347 B1 * | 6/2001 | Vasudev et al. | 438/680 |

(Continued)

FOREIGN PATENT DOCUMENTS

| | | |
|---|---|---|
| JP | 11-87248 | 3/1999 |
| JP | 2005-19960 | 1/2005 |

*Primary Examiner* — Michael Kornakov
*Assistant Examiner* — Ryan Coleman
(74) *Attorney, Agent, or Firm* — Rothwell, Figg, Ernst & Manbeck, P.C.

(57) ABSTRACT

A plasma processing apparatus includes a processing chamber, in which a wafer W is plasma-processed, and a CPU controlling an operation of each component. A processing gas is introduced into the processing chamber under a first condition defined by a flow rate and a molecular weight of the processing gas, specifically based on a magnitude of a product $A_1$ ($=Q_1 \times m_1$) of the flow rate $Q_1$ and the molecular weight $m_1$ of the processing gas, and a surface of the wafer W is physically or chemically etched. And then, a pre-purge gas which may be identical to or different from the processing gas is introduced into the processing chamber through a shower head under a second condition derived from the first condition.

5 Claims, 5 Drawing Sheets

(56) References Cited

U.S. PATENT DOCUMENTS

| | | |
|---|---|---|
| 6,394,104 B1 | 5/2002 | Chen et al. |
| 2001/0016674 A1 | 8/2001 | Pang et al. |
| 2003/0000546 A1* | 1/2003 | Richardson et al. .......... 134/1.1 |
| 2003/0010354 A1* | 1/2003 | Goto et al. ................... 134/1.1 |
| 2003/0159711 A1 | 8/2003 | Blonigan et al. |
| 2003/0170390 A1 | 9/2003 | Derraa et al. |
| 2004/0013818 A1 | 1/2004 | Moon et al. |
| 2004/0018727 A1 | 1/2004 | Yokogawa et al. |

* cited by examiner

CLEANING METHOD OF PROCESSING APPARATUS, PROGRAM FOR PERFORMING THE METHOD, AND STORAGE MEDIUM FOR STORING THE PROGRAM

CROSS REFERENCE TO RELATED APPLICATION

This application is a Continuation-In-Part Application of application Ser. No. 11/338,778 filed on Jan. 25, 2006.

FIELD OF THE INVENTION

The present invention relates to a cleaning method of a processing apparatus, a program for performing the method, and a storage medium for storing the program; more particularly, to a cleaning method of a processing apparatus having a chamber in which a plasma atmosphere of a processing gas is formed.

BACKGROUND OF THE INVENTION

Conventionally, in a processing apparatus having an accommodation chamber for accommodating a substrate, when a processing gas or a purge gas is introduced into the chamber, it is known that particles attached to an inner wall of the chamber or surfaces of electrodes in the chamber are dispersed by a gas viscous force generated in a gas flow. If the dispersed particles are attached to the substrate, they give rise to such problems that they act as a mask during an etching processing of the substrate to form an etching residue, and as nuclei to deteriorate a film quality during a film forming process. Since an introduction of the processing gas or the purge gas into the chamber is indispensable during a substrate processing, a countermeasure for preventing particles from being dispersed when the gas is introduced into the chamber is required to solve the aforementioned problems.

For example, in Patent Document 1, in an apparatus including: a plasma generation chamber formed as a cylindrical resonator; a first magnetizing coil concentrically surrounding the plasma generation chamber; a second magnetizing coil coaxially disposed with the first magnetizing coil at a farther position than the first magnetizing coil from a wafer adsorption surface of a sample table; a vacuum exhaust device having a turbo-molecular pump and a dry pump connected to an outlet side of the turbo-molecular pump; and the like, there is provided a method including the steps of: forming a mirror magnetic field by the first magnetizing coil and the second magnetizing coil; cleaning an inside of the apparatus by using a gas in a high pressure region, wherein a gas pressure in the mirror magnetic field and the apparatus is $1.3 \times 10^{-2} \sim 1.3 \times 10^{-1}$ kPa (0.1~1.0 Torr); and further, cleaning the inside of the apparatus by using a gas in a low pressure region, wherein a gas pressure in the mirror magnetic field and the apparatus is $6.7 \times 10^{-3} \sim 1.3 \times 10^{-1}$ kPa ($5.0 \times 10^{-2} \sim 1.0$ Torr).

Further, in Patent Document 2, in a dry etching apparatus including: a circular upper electrode and a circular lower electrode in a chamber disposed to be parallel to the chamber; and a gas inlet line for introducing a processing gas or the like in the chamber, there is provided a method for removing carbon based deposits attached to an inside of the chamber by active species of oxygen, including the steps of: fully exhausting the chamber to a vacuum; introducing an oxygen gas for cleaning into the chamber through the gas inlet line controlling a supply and a discharge of the gas to adjust a pressure in the chamber; and applying a predetermined powers to the upper electrode and the lower electrode to convert the oxygen gas into a plasma.

Patent Document 1: Japanese Patent Laid-open Application No. H4-186833

Patent Document 2: Japanese Patent Laid-open Application No. 2000-195830

However, when the carbon based deposits causing the generation of the particles are removed, in case the powers applied to the upper electrode and the lower electrode and the pressure in the chamber are not optimized, the carbon based deposits cannot be removed uniformly, and further, parts in the chamber can be damaged, resulting in a problem that the particles are generated in the chamber.

SUMMARY OF THE INVENTION

It is, therefore, an object of the present invention to provide a cleaning method of a processing apparatus, a program for performing the method, and a storage medium for storing the program to prevent a generation of particles in a chamber.

In accordance with an aspect of the present invention, there is provided a cleaning method of a processing apparatus having a processing chamber in which a target object is plasma-processed, including the steps of: plasma-processing the target object by using a plasma generated from a first gas introduced under a first condition defined by at least a gas flow rate and a gas molecular weight; and introducing a second gas under a second condition derived from the first condition.

In accordance with the cleaning method, the target object is plasma-processed by using the plasma generated from the first gas introduced under the first condition defined by at least the gas flow rate and the gas molecular weight, and the second gas is introduced under the second condition derived from the first condition. Therefore, the particles can be removed from an inside of the processing chamber by a gas viscous force of the gas introduced under the second condition, and thus, the generation of the particles in the processing chamber can be prevented.

Preferably, the cleaning method further includes, after the step of introducing the second gas, the step of generating a plasma of a third gas in the processing chamber.

In accordance with this cleaning method, the plasma of a third gas is generated in the processing chamber after the step of introducing the second gas. Therefore, deposits causing the generation of the particles can be removed by the plasma generated from the gas, and thus, the generation of the particles in the processing chamber can also be prevented.

In the cleaning method, the first gas may be identical to or different from the second gas.

In case the first gas is identical to the second gas, the particles can be conveniently removed from the inside of the processing chamber without a change of the gas introduced in the chamber.

On the other hand, in case the first gas is different from the second gas, a gas which can generate the gas viscous force for removing the particles more effectively can be selected.

Further, in the cleaning method, the second gas may be identical to the third gas.

In case the second gas is identical to the third gas, the particles can be more conveniently removed from the inside of the processing chamber without a change of the gas introduced in the processing chamber.

Further, in the cleaning method, it is preferable that a magnitude of a product $A_2$ of a gas flow rate and a gas molecular weight under the second condition is greater than that of a product $A_1$ of the gas flow rate and the gas molecular weight under the first condition.

In accordance with this cleaning method, a magnitude of the product $A_2$ of the gas flow rate and the gas molecular weight under the second condition is greater than that of the product $A_1$ of the gas flow rate and the gas molecular weight under the first condition. Therefore, the particles can be certainly removed from the inside of the processing chamber by the gas viscous force of the gas introduced under the second condition.

Preferably, in the cleaning method, during the step of generating the plasma, a flow rate of the third gas is equal to or greater than 1.4 Pa·m$^3$/s (800 sccm), a pressure in the processing chamber is $1.3 \times 10^{-2} \sim 4.0 \times 10^{-2}$ kPa (100~300 mTorr), and a high frequency power applied in the processing chamber is 200~400 W.

In accordance with this cleaning method, during the step of generating the plasma, the flow rate of the third gas introduced in the processing chamber is equal to or greater than 1.4 Pa·m$^3$/s (800 sccm), the pressure in the processing chamber is $1.3 \times 10^{-2} \sim 4.0 \times 10^{-2}$ kPa (100~300 mTorr), and the high frequency power applied in the processing chamber is 200~400 W. Therefore, the deposits can be removed by the plasma generated from the gas without inflicting any damage on parts in the processing chamber.

In accordance with another aspect of the present invention, there is provided a program for performing, on a computer, a cleaning method of a processing apparatus having a processing chamber in which a target object is plasma-processed, the program including: a plasma processing module by which the target object is plasma-processed by using a plasma generated from a first gas introduced under a first condition defined by at least a gas flow rate and a gas molecular weight, and a gas introduction module by which a second gas is introduced under the second condition derived from the first condition, wherein a magnitude of a product $A_2$ of a gas flow rate and a gas molecular weight under the second condition is greater than that of the product $A_1$ of the gas flow rate and the gas molecular weight under the first condition.

In accordance with still another aspect of the present invention, there is provided a computer readable storage medium for storing the above-described program.

In accordance with the program and the storage medium, the target object is plasma-processed by using the plasma generated from the first gas introduced under the first condition defined by at least the gas flow rate and the gas molecular weight, and the second gas is introduced under the second condition derived from the first condition, and the magnitude of the product $A_2$ of the gas flow rate and the gas molecular weight under the second condition is greater than that of the product $A_1$ of the gas flow rate and the gas molecular weight in the first condition. Therefore, the particles can be removed from the inside of the processing chamber by the gas viscous force of the second gas introduced under the second condition, and thus, the generation of the particles in the processing chamber can be prevented.

BRIEF DESCRIPTION OF THE DRAWINGS

The above and other objects and features of the present invention will become apparent from the following description of preferred embodiment given in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
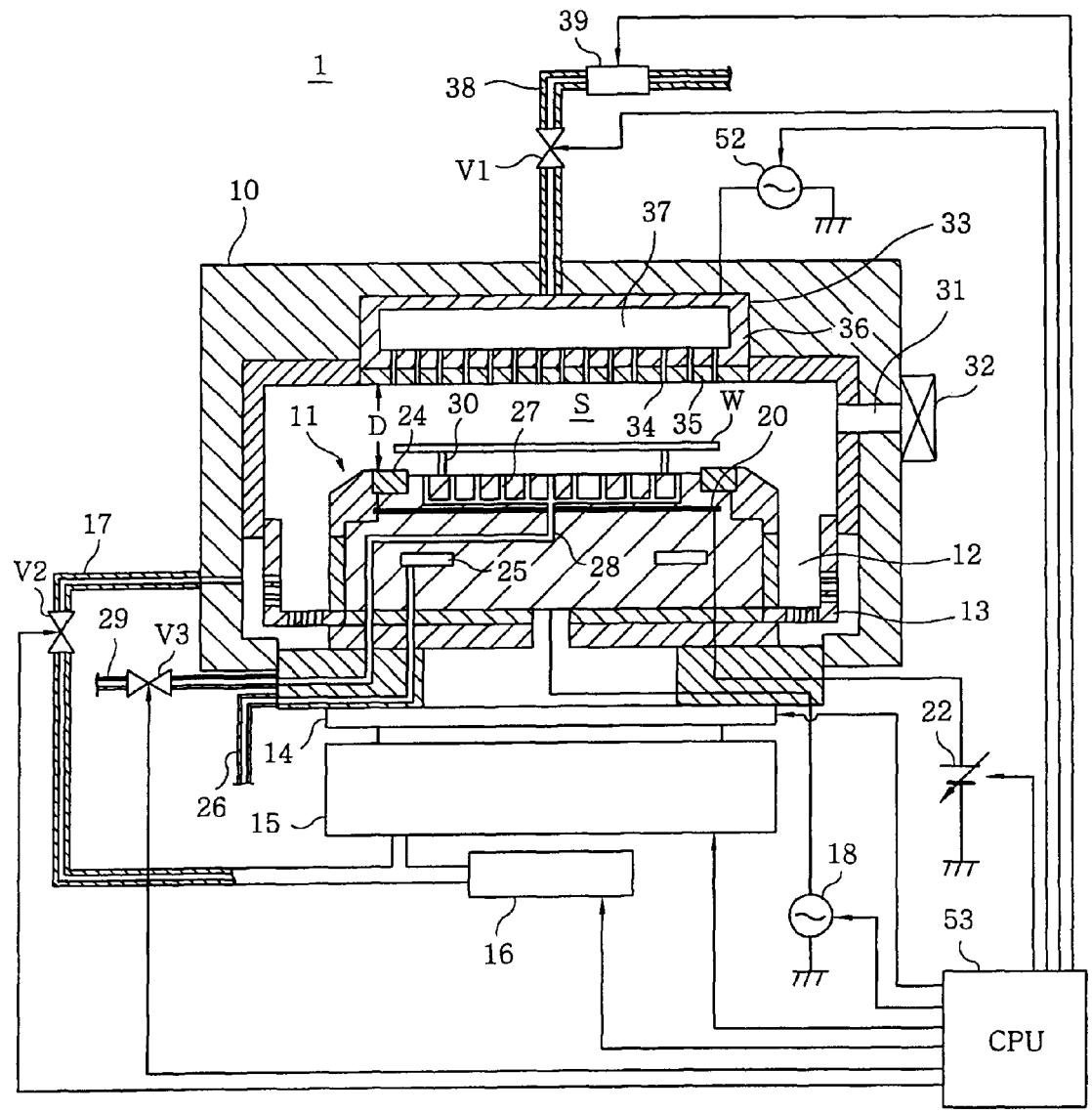
FIG. 1 offers a cross sectional view for schematically showing a configuration of a plasma processing apparatus to which a cleaning method of a processing apparatus in accordance with a preferred embodiment of the present invention is applied.

FIG. 1 is a cross sectional view for schematically showing a configuration of a plasma processing apparatus to which a cleaning method of a processing apparatus in accordance with a preferred embodiment of the present invention is applied.

Referring to FIG. 1, the plasma processing apparatus 1 configured as an etching processing apparatus performing an etching processing on a wafer W includes a cylindrical chamber (a processing chamber) 10 made of a metal such as an aluminum or stainless steel, and a susceptor 11 of a cylindrical shape is disposed in the chamber 10 as a stage for mounting a wafer W having a diameter of, e.g., 300 mm.

An exhaust passageway 12 functioning as a flow path for exhausting a gas filled above the susceptor 11 to the outside of the chamber 10 is formed between a sidewall of the chamber 10 and the susceptor 11. An annular evacuation plate 13 is disposed in the exhaust passageway 12 and a space at the downstream side of the evacuation plate 13 disposed in the exhaust passageway 12 communicates with an automatic pressure control valve (hereinafter referred to as an ⌈APC₁⌉) 14 which is a variable butterfly valve. The APC is connected to a turbo-molecular pump (hereinafter referred to as a ⌈TMP₁⌉) 15 which is a gas exhaust pump for vacuum exhaustion, and further connected to a dry pump (hereinafter referred to as a ⌈DP₁⌉) 16 which is a gas exhaust pump via the TMP 15. A gas exhaust path including the APC 14, the TMP 15 and the DP 16 is hereinafter referred to as a ⌈main pumping line₁⌉. Not only does the main pumping line control a pressure in the chamber 10 by using the APC 14, but it also reduces a pressure in the chamber 10 by using the TMP 15 and the DP 16 to an almost vacuum state.

Further, the above-described space at the downstream side of the evacuation plate 13 disposed in the exhaust passageway 12 is connected to another gas exhaust path (hereinafter referred to as a ⌈rough pumping line₁⌉) different from the main pumping line. The rough pumping line includes an exhaust line 17 whose diameter is, e.g., 25 mm and which makes the space at the downstream side of the evacuation plate 13 communicate with the DP 16, and a valve V2 disposed in the middle of the exhaust line 17. The valve V2 can isolate the DP 16 from the space at the downstream side of the evacuation plate 13. The rough pumping line discharges the gas in the chamber 10 by using the DP 16.

A high frequency power supply 18 for applying a predetermined high frequency power to the susceptor 11 is connected to the susceptor 11. Further, a circular plate shaped electrode plate 20 made of a conductive film is disposed at an upper portion of an inside of the susceptor 11 for adsorbing a wafer W with the help of an electrostatic adsorptive force. A DC power supply 22 is electrically connected to the electrode plate 20. The wafer W is adsorptively held on a top surface of the susceptor 11 by a Coulomb force or a Johnsen-Rahbek force generated by a DC voltage applied from the DC power supply 22 to the electrode plate 20. When the electrode plate 20 is switched off from the DC power supply 22, the wafer is not adsorbed to the top surface of the susceptor 11 and enters in a floating state. Further, a circular ring-shaped focus ring 24 made of silicon (Si) or the like converges a plasma formed above the susceptor 11 toward the wafer W.

An annular coolant chamber 25, for example, continuously disposed in a circumferential direction is provided in the susceptor 11. A coolant, e.g., cooling water, maintained at a predetermined temperature is supplied to be circulated via a line 26 from a chiller unit (not shown) to the coolant chamber 25 such that a process temperature of the wafer W on the susceptor 11 is controlled by the temperature of the coolant.

A plurality of thermally conductive gas supply openings 27 and a number of thermally conductive gas supply grooves (not shown) are disposed at a portion on which the wafer W is attached (hereinafter referred to as an ┌adsorption surface┐), on the top surface of the susceptor 11. These thermally conductive gas supply openings 27 and the like communicate with a thermally conductive gas feed pipe 29 having a valve V3 via a thermally conductive gas supply line 28 disposed in the susceptor 11, and supply a thermally conductive gas, e.g., a He gas, from a thermally conductive gas supply unit (not shown) connected to the thermally conductive gas feed pipe 29 to a space between the adsorption surface and a backside of the wafer W. Accordingly, a thermal transfer between the wafer W and the susceptor 11 can be improved. Further, the valve V3 can isolate the thermally conductive gas supply openings 27 and the like from the thermally conductive gas supply unit.

Further, a plurality of pusher pins 30 acting as lift pins and protrusile from the top surface of the susceptor 11 is disposed in the adsorption surface. A rotary motion of a motor (not shown) is converted into a rectilinear movement by a ball screw or the like, and thus, these pusher pins 30 are moved up and down, in the drawing. When the wafer W is adsorptively supported on the adsorption surface, the pusher pins 30 are received in the susceptor 11. On the other hand, after the etching processing or the like is completed, and when the wafer W on which a plasma processing is completed is unloaded from the chamber 10, the pusher pins 30 are protruded from the top surface of the susceptor 11. Accordingly, the wafer W is separated from the susceptor 11 to be lifted up.

At a ceiling portion of the chamber 10, a shower head 33 is disposed. A high frequency power supply 52 is connected to the shower head 33, and the high frequency power supply 52 applies a predetermined high frequency power to the shower head 33. Accordingly, the shower head 33 functions as an upper electrode.

The shower head 33 includes an electrode plate 35 having a plurality of gas ventholes 34 as a bottom surface thereof and an electrode supporting member 36 for attachably/detachably supporting the electrode plate 35. Further, a buffer chamber 37 is provided in the electrode supporting member 36, and a processing gas inlet pipe 38 from a processing gas supply unit (not shown) is connected to the buffer chamber 37. A valve V1 is disposed in the middle of the processing gas inlet pipe 38. The valve V1 can isolate the processing gas supply unit from the buffer chamber 37. Herein, a distance D between the electrodes, or the susceptor 11 and the shower head 33 is set to be larger than, for example, 27±1 mm.

On an upstream side of the processing gas inlet pipe 38, a mass flow controller 39 is attached to control a flow rate of a processing gas or the like being introduced into the chamber 10. The mass flow controller 39 is electrically connected to a CPU 53 (described later) and controls the flow rates of the processing gas and a purge gas introduced into the chamber 10 based on signals from the CPU 53.

A gate valve 32 for opening and closing a loading/unloading port 31 for the wafer W is attached on the sidewall of the chamber 10. As described above, high frequency powers are applied to the susceptor 11 and the shower head 33 in the chamber 10 of the plasma processing apparatus 1. Therefore, a high-density plasma is generated by the applied high frequency power in a space S from the processing gas to form ions or radicals.

Further, the plasma processing apparatus 1 includes the CPU 53 disposed inside or outside of the plasma processing apparatus 1. The CPU 53 is connected to the valve V1, V2 and V3, the APC 14, the TMP 15, the DP 16, the high frequency power supply 18 and 52, the mass flow controller 39 and the DC power supply 22 to control an operation of each component in accordance with a command of a user or a predetermined process recipe.

In the plasma processing apparatus 1, when the etching processing is performed, the gate valve 32 is first opened, and then the wafer W is loaded into the chamber as a processing object to be mounted on the susceptor 11. After that, the gate valve 32 is closed. Further, the processing gas (for example, a mixed gas containing a $C_4F_8$ gas, an $O_2$ gas and an Ar gas with a predetermined flow rate ratio) is introduced through the shower head 33 into the chamber 10 under a first condition defined by a gas flow rate and a gas molecular weight, and the pressure in the chamber 10 is adjusted to be kept at a predetermined pressure by the APC 14 and the like. Next, a high frequency power is applied to the shower head 33 from the high frequency power supply 52, and at the same time, another high frequency power is applied to the susceptor 11 from the high frequency power supply 18. Further, the DC voltage is applied from the DC power supply 22 to the electrode plate 20 to make the wafer W be adsorbed on the susceptor 11. Further, the processing gas injected through the shower head 33 is converted into the plasma as described above. The radicals and the ions generated by the plasma are converged on a surface of the wafer W with the help of the focus ring 24, and then, the surface of the wafer W is physically or chemically etched.

After the wafer W is etched, the gate valve 32 is opened, and then, the wafer W mounted on the susceptor 11 is unloaded from the chamber 10, and the gate valve 32 is closed again.

Next, before a new wafer W is loaded into the chamber as a processing object, a cleaning processing (described later) is performed to clean an inside of the chamber 10, and then, the gate valve 32 is opened, and the new wafer W is loaded into the chamber 10 to be mounted on the susceptor 11. After that, the same process is repeated as in the case the above-described wafer W is loaded into the chamber 10 to have the etching processing performed on the new wafer W.

Figure 2:
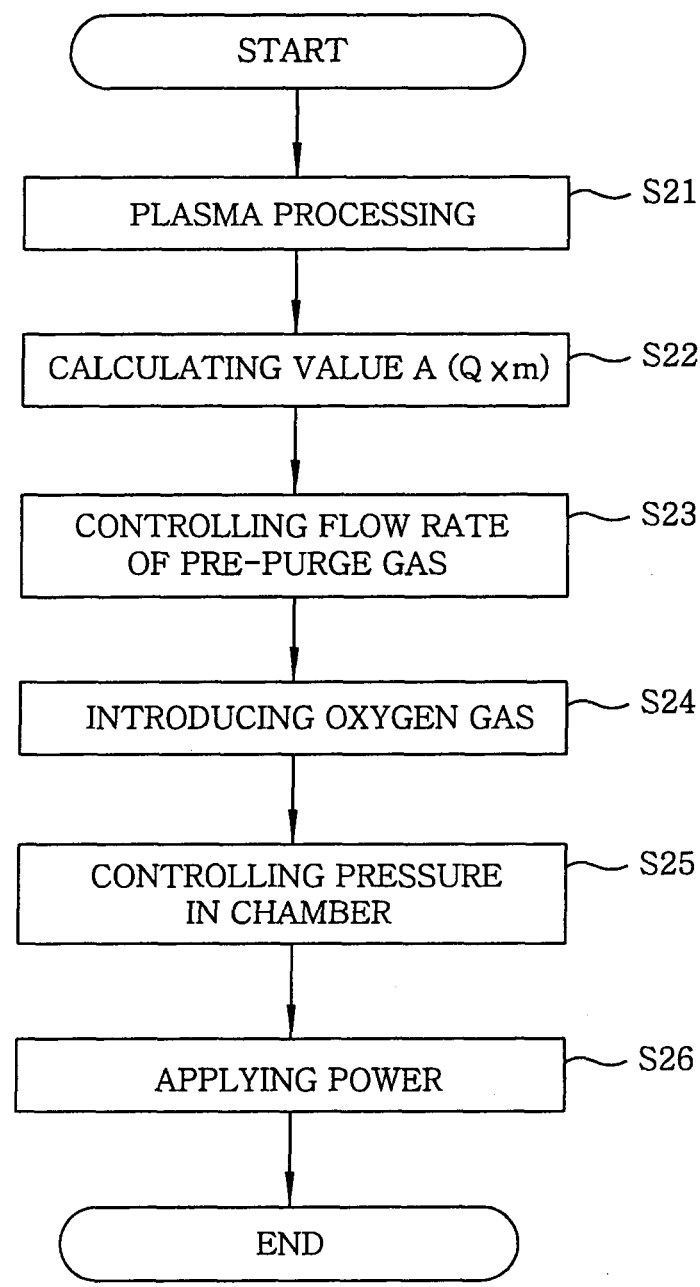
FIG. 2 shows a flowchart for explaining the cleaning method of the processing apparatus in accordance with the preferred embodiment.

FIG. 2 is a flowchart explaining the cleaning method of the processing apparatus in accordance with the present preferred embodiment.

Referring to FIG. 2, the plasma processing apparatus 1 as a processing apparatus loads the wafer W as a processing object into the chamber 10, and introduces the processing gas into the chamber 10 under the first condition defined by the gas flow rate and the gas molecular weight of the processing gas, specifically a product $A_1$ ($=Q_1 \times m_1$) of the flow rate $Q_1$ and the molecular weight $m_1$ of the processing gas. After the surface of the wafer W is physically or chemically etched (a step of plasma-processing) (step S21), the gate valve 32 is opened, and the wafer W mounted on the susceptor 11 is dismounted therefrom to be unloaded from the chamber 10, and the gate valve 32 is closed.

Next, before a new wafer W is loaded into the chamber as a processing object, a pre-purge gas is introduced into the chamber 10 (a step of introducing the gas). That is, a pre-purge gas (for example, oxygen, argon, nitrogen, or any combination gas thereof) different from the processing gas is introduced into the chamber 10 through the shower head 33 under a second condition derived from the first condition, and the pressure in the chamber 10 is adjusted to be kept at a predetermined pressure by using the APC 14 and the like. Accordingly, a pre-purge gas generating a gas viscous force that can remove particles more effectively can be selected.

Herein, the magnitude of a product $A_2$ corresponding to the pre-purge gas needed to be introduced into the chamber 10 to remove the particles which are not peeled off from the chamber 10 by the processing gas introduced based on a value of the product $A_1$ needs to be greater than that of the product $A_1$. Therefore, to be more specific, the CPU 53 calculates the magnitude of the product $A_2$ ($=Q_2 \times m_2$) of a flow rate $Q_2$ and a molecular weight $m_2$ of the pre-purge gas (a step of calculating) (step S22), and sets the flow rate $Q_2$ of the pre-purge gas such that the magnitude of the product $A_2$ ($=Q_2 \times m_2$) is greater than that of the product $A_1$ of the flow rate $Q_1$ and the molecular weight $m_1$ of the processing gas introduced into the chamber 10 when the wafer W is processed, for example, 1.05 times the magnitude of the product $A_1$, and further, transmits a signal corresponding to the flow rate $Q_2$ set at the mass flow controller 39 to control the flow rate of the pre-purge gas (step S23). Further, with the flow rate $Q_2$ set as described above, the pre-purge gas is introduced into the chamber 10 for 1.0~10 seconds, and then, the introduced pre-purge gas is discharged from the chamber 10. Accordingly, the particles in the chamber 10 are removed.

In case that the processing gas is a gaseous mixture, the magnitude of the product $A_1$ corresponding to the processing gas may be calculated by summing the product of the gas flow rate and the gas molecular weight of each of all the constituent gases of the gaseous mixture. For instance, if the processing gas is the gaseous mixture and consists of $N_2$ gas and Ar gas whose molecular weights 28 and 40, respectively, and if their flow rates 200 and 1000 sccm, respectively, the magnitude of the product $A_1$ of the gaseous mixture is 45600(=200×28+1000×40). If the pre-purge gas is also a gaseous mixture, the magnitude of the product A2 of the pre-purge gas can be calculated in the same manner.

Further, an oxygen gas for a dry cleaning is introduced through the shower head 33 into the chamber 10 (step S24), and an amount of a supply and that of a discharge of the oxygen gas are controlled to adjust the pressure in the chamber 10 to be kept at a predetermined value (step S25). After that, the high frequency power is applied to the shower head 33 from the high frequency power supply 52 (a step of generating the plasma) (step S26). Accordingly, the oxygen gas in the chamber 10 is converted into the plasma, and deposits remaining in the chamber 10 after introducing the pre-purge gas are removed (ashed) by the plasma.

After applying the high frequency power to the shower head 33 for a predetermined time period to convert the oxygen gas in the chamber 10 into the plasma, the application of the high frequency power to the shower head 33 is stopped. After the oxygen gas is discharged from the chamber 10, the present processing is completed.

As described above, in accordance with the present preferred embodiment, the wafer W is plasma-processed by using the plasma generated from the processing gas introduced into the chamber 10 for performing the etching processing on the wafer W under the first condition defined by the gas flow rate and the gas molecular weight, and the pre-purge gas is introduced under the second condition derived from the first condition. Therefore, the particles can be removed from the inside of the chamber 10 by the gas viscous force of the pre-purge gas introduced under the second condition and thus, a generation of the particles in the chamber 10 can be prevented.

Further, because the plasma is generated in the chamber 10 after the pre-purge gas is introduced into the chamber 10, the deposits causing the generation of the particles can be removed by the plasma generated from the oxygen gas, and thus, the generation of the particles in the chamber 10 can also be prevented.

Moreover, because the magnitude of the product $A_2$ of the flow rate $Q_2$ and the molecular weight $m_2$ of the pre-purge gas under the second condition is greater than that of the product $A_1$ of the flow rate $Q_1$ and the molecular weight $m_1$ of the processing gas under the first condition, the particles can be certainly removed from the inside of the chamber 10 by the gas viscous force of the pre-purge gas introduced under the second condition.

In accordance with the present preferred embodiment, a pre-purge and an ashing of the deposits in the chamber 10 are performed on a single wafer basis, but the present invention is not limited thereto. The pre-purge and the ashing of the deposits in the chamber 10 may be performed at an arbitrary timing, for example, after the processing of a predetermined number of wafers is completed.

Further, in accordance with the present preferred embodiment, the CPU 53 sets the flow rate $Q_2$ of the pre-purge gas so that the magnitude of the product $A_2$ of the flow rate $Q_2$ and the molecular weight $m_2$ of the pre-purge gas is greater than that of the product $A_1$, for example, 1.05 times the magnitude of the product $A_1$, but the present invention is not limited thereto. The flow rate $Q_2$ of the pre-purge gas may be set by adding a predetermined value, for example, $1.69 \times 10^{-1}$ Pa·m$^3$/s (100 sccm) to the calculated value based on the calculated magnitude of the product $A_1$.

In accordance with the present preferred embodiment, the processing gas (for example, a mixed gas containing a $C_4F_8$ gas, an $O_2$ gas and an Ar gas with a predetermined flow rate ratio) is different from the pre-purge gas (for example, oxygen, argon and/or nitrogen, or a mixed gas containing the gases), but the present invention is not limited thereto. The processing gas may be identical to the pre-purge gas. Accordingly, the particles can be conveniently removed from the inside of the chamber 10 without a change of the gas introduced into the chamber 10.

Further, in accordance with the present preferred embodiment, the pre-purge gas is different from the gas for the dry cleaning introduced when the deposits remaining in the chamber 10 is ashed, but the present invention is not limited thereto. The pre-purge gas may be identical to the gas for the dry cleaning. Accordingly, the particles can be more conveniently removed from the inside of the chamber 10 without changing the gas introduced into the chamber 10.

Further, the cleaning method of the processing apparatus in accordance with the present preferred embodiment is applied to the plasma processing apparatus 1, but the present invention is not limited thereto. It may be applied to all the processing apparatuses having a chamber.

In accordance with the preferred embodiment described above, a target object processed in the plasma processing apparatus 1 is a wafer W, but the present invention is not limited thereto. The target object may be a glass substrate such as a FPD (Flat Panel Display) or the like including a LCD (Liquid Crystal Display).

Further, the object of the present invention is also achieved by supplying a storage medium, which records a program code of software for realizing the functions of the above-mentioned preferred embodiment to a system or an apparatus, and reading out and executing the program code stored in the storage medium by a computer (or a CPU, MPU or the like) of the system or an apparatus.

In this case, the program code itself read out from the storage medium realizes the functions of the above-mentioned preferred embodiment, and the program code, the storage medium which stores the program code and a program are included to form the present invention.

Further, as the storage medium for supplying the program code, for example, a floppy (registered trademark) disk, a hard disk, an optical disk, a magneto-optical disk, a CD-ROM, a CD-R, a CD-RW, a DVD-ROM, a DVD-RAM, a DVD-RW, a DVD+RW, a magnetic tape, a nonvolatile memory card, a ROM, or the like may be used. Otherwise, the program is supplied by downloading from another computer, a database or the like (not shown) connected to an internet, a commercial network, a local area network or the like.

Also, with the execution of the program code read by the computer, the functions of above-mentioned preferred embodiment are realized. In addition, an OS (operating system) or the like that runs on the computer may execute a part or all of the actual processing on the basis of the instructions of the program code to realize the functions of the above-mentioned preferred embodiment through that processing.

In addition, after the program code read from the storage medium is written into a memory provided in a function extension board inserted into the computer or in a function extension unit connected to the computer, the CPU or the like provided in the function extension board or in the function extension unit conducts a part or all of the actual processing on the basis of the instructions of the program code, and the functions of the above-mentioned preferred embodiment may be realized by that processing.

Hereinafter, test examples of the present invention will be described.

First, when the processing gas or the purge gas is introduced into the chamber 10, to prevent the particles from being dispersed, a peeling of the particles or the deposits caused by a gas flow of the processing gas, the purge gas or the like needs to be prevented before a new wafer W is loaded into the chamber 10 of the plasma processing apparatus 1.

The particles adhered to the inside of the chamber 10, for example, adhered on an inner wall of the chamber 10, are peeled off from the inner wall of the chamber 10 by an exertion of a peeling force generated by the processing gas or the purge gas. The force exerted on the particles to cause its peeling is a force called the gas viscous force that is proportional to an average flow velocity of a gas and is given by the following equation.

$$k_N = N v_R^2 m_n (\pi r_p^2)$$ [Equation 1]

(N: gas density, $v_R$: average flow velocity of a gas, $m_n$: gas molecular weight, $r_p$: particle radius)

The particles adhered on the inner wall of the chamber 10 are peeled off from the inner wall of the chamber 10 by the gas viscous force given by the above equation, when colliding repeatedly with gas molecules to thereby be floated around in the chamber 10 again. The particles floating in the chamber 10 again are accelerated in a direction of the gas flow. In the above equation, under the assumption that the gas pressure and the particle radius are constant, the gas viscous force $k_N$ is proportional to the average flow velocity of a gas and the gas molecular weight. Accordingly, nitrogen, argon and oxygen, each having a different molecular weight, were introduced into the chamber 10 with a flow rate of each being controlled, and then, a CCD camera was used to observe the particles floating in the chamber 10, when the gases were introduced at various flow rates. Specifically, the flow rates of the nitrogen, the argon and the oxygen were controlled, respectively, as shown in Table 1, and the particles were successively measured from a step 1 to a step 10. The result is shown in Table 1.

TABLE 1

| Step | 1 | 2 | 3 | 4 | 5 |
|---|---|---|---|---|---|
| Ar[sccm] | 500 | 500 | — | 500 | — |
| N₂[sccm] | — | — | 500 | — | 800 |
| O₂[sccm] | — | — | — | — | — |
| Total[sccm] | 500 | 500 | 500 | 500 | 800 |
| A (Q · m) | 20000 | 20000 | 14000 | 20000 | 22400 |
| Particle | observed | observed | Not observed | observed | observed |

| Step | 6 | 7 | 8 | 9 | 10 |
|---|---|---|---|---|---|
| Ar[sccm] | 500 | 1000 | — | 1000 | 1000 |
| N2[sccm] | — | — | 1500 | — | — |
| O2[sccm] | — | — | — | — | 200 |
| Total[sccm] | 500 | 1000 | 1500 | 1000 | 1200 |
| A (Q · m) | 20000 | 40000 | 42000 | 40000 | 46400 |
| Particle | Not observed | observed | observed | not observed | observed |

First, when the argon was introduced at a flow rate of $8.45 \times 10^{-1}$ Pa·m³/s (500 sccm), the particles floating in the chamber 10 were observed (step 1). However, when the nitrogen was introduced at the same flow rate (500 sccm) as that of the argon (step 3), the particles were not observed. Moreover, when the argon was introduced into the chamber at the flow rate of 500 sccm again, the particles were observed (step 4). Such a result that the particles were not observed when the nitrogen was introduced, is considered due to the fact that, although the flow rates of the nitrogen and the argon are same, the molecular weights of the nitrogen and the argon are different, and thus, when the nitrogen was introduced into the chamber, the magnitude of a product A of a flow rate Q and a molecular weight m was reduced, and the magnitude of the peeling force (the gas viscous force) was also reduced, and thus, the particles were not peeled off.

After that, when the nitrogen gas was introduced at a flow rate of 2.5 Pa·m³/s (1500 sccm), the particles were observed (step 8), and then, when the argon was introduced at a flow rate of 1.7 Pa·m³/s (1000 sccm), the particles were not observed (step 9). Moreover, when the argon was introduced at the flow rate of 1.7 Pa·m³/s (1000 sccm), and the oxygen was introduced at a flow rate of 3.38×10⁻¹ Pa·m³/s (200 sccm) at the same time, the particles were observed (step 10). In the step 10, such a result that the particles were observed is considered due to the fact that, although a total flow rate of the gases (the argon and the oxygen) was lower than that in the step 8, the magnitude of the product A of the flow rate Q and the molecular weight m was greater than that of the product A in the step 9.

Herein, as shown in Table 1, the magnitude of the product A in the step 3 is smaller than that of the product A in each of the steps 1 and 2 performed before the step 3, and the magnitude of the product A in the step 6 is equal to or smaller than that of the product A in each of the steps 4 and 5 performed before the step 6, and the magnitude of the product A in the step 9 is equal to or smaller than that of the product A in each of the steps 7 and 8 performed before the step 9, and the particles were not observed in any of the steps 3, 6 and 9.

Accordingly, it can be known that the particles are not generated if the gases are introduced under a condition in which the flow rates and the molecular weights of the gases are set such that the magnitude of the product A becomes a predetermined value (steps 1, 2, 4, 5, 7 and 8), and then, after that, the gases are introduced under another condition in which the flow rates and the molecular weights of the gases are set such that the magnitude of the product A becomes smaller than the predetermined value (steps 3, 6 and 9). Such a result is considered due to the fact that, the particles or the deposits causing the generation of the particles can be certainly removed from the inside of the chamber 10 by the gas viscous force of the gases while the gases were being introduced under the former condition in which the flow rates and the molecular weights of the gases were set such that the magnitude of the product A became the predetermined value.

Therefore, in case this study is applied to the above-described preferred embodiment of the present invention, that is, in case the flow rate of the pre-purge gas is controlled so that the magnitude of the product $A_2$ of the flow rate and the molecular weight of the pre-purge gas is greater than that of the product $A_1$ of the flow rate and the molecular weight of the processing gas and that of the product $A_p$ of the flow rate and the molecular weight of the purge gas, it can be known that the particles or the deposits that cause the generation of the particles can be certainly removed from the inside of the chamber 10 by the gas viscous force of the pre-purge gas when the pre-purge gas is introduced.

Hereinafter, an optimum condition of the dry cleaning (WLDC) for removing the deposits deposited in the chamber of the plasma processing apparatus will be described.

Figure 3:
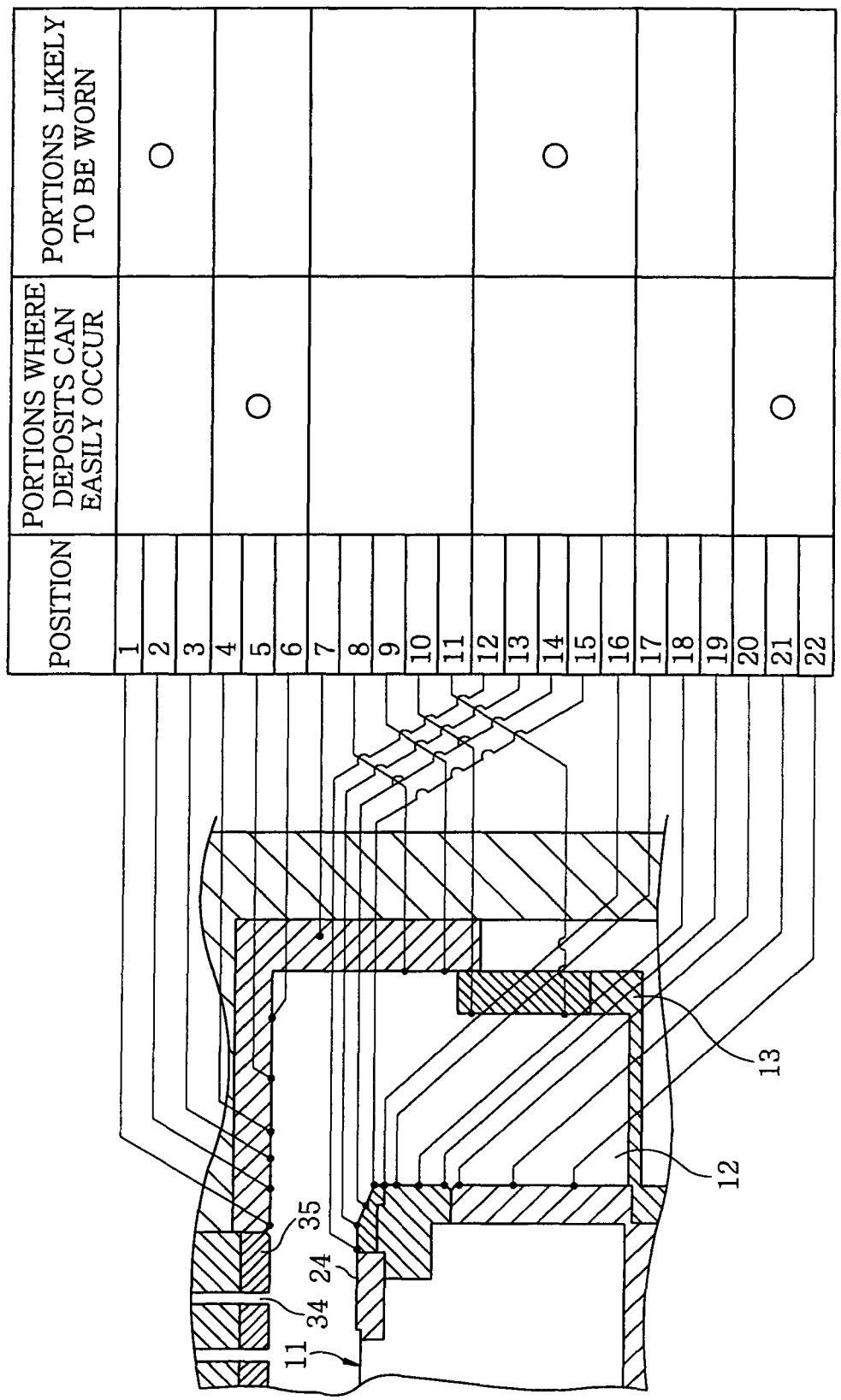
FIG. 3 is a drawing for illustrating positions to which polyimide films are attached in a chamber 10 shown in FIG. 1.

Next, as a test example 1, the high frequency power applied to the shower head 33 as the upper electrode was set at 300 W to convert the oxygen gas in the chamber 10 into the plasma, and then, polyimide films were attached to predetermined positions in the chamber 10 as shown by 1~22 in FIG. 3 to measure an ashing rate (nm/sec) of each polyimide film. Further, as a comparative example 1 and a comparative example 2, the ashing rate of the each polyimide film was measured when the high frequency power was set at 500 W and at 800 W.

Successively, from values of the ashing rates of the polyimide films measured as described above, (1) a uniformity of the ashing rates of the polyimide films at all the portions (hereinafter referred to as simply a ⌈uniformity」) and (2) a ratio of an average ashing rate of the polyimide films attached at portions 4~6 and portions 20~22 where the deposits can easily occur (portions where a large amount of deposits can be most likely deposited) to an average ashing rate of the polyimide films attached at portions 1~3 and portions 12~16 which are portions most likely to be worn by the plasma (hereinafter referred to as simply an ⌈ashing efficiency」) were calculated, and the calculated values for the test example 1, the comparative example 1 and the comparative example 2 are described in Table 2 below.

TABLE 2

|  | High Frequency Power [W] | Average Ashing Rate of All Portions [nm/sec] | Average Ashing Rate of Portions Where Deposits Can Easily Occur [nm/sec] | Average Ashing Rate of Portions Likely To Be Worn [nm/sec] | Uniformity of Ashing Rates of All Portions [%] | Ashing Efficiency |
|---|---|---|---|---|---|---|
| Test Example 1 | 300 | 0.49 | 0.42 | 0.85 | 84 | 0.5 |
| Comparative Example 1 | 500 | 0.69 | 0.65 | 1.2 | 75 | 0.56 |
| Comparative Example 2 | 800 | 0.91 | 0.85 | 1.6 | 78 | 0.53 |

Moreover, as a test example 2, the ashing rates of the polyimide films were measured when the amount of the oxygen gas introduced into the chamber 10 was 1.4 Pa·m³/s (800 sccm), and further, as a comparative example 3 and a comparative example 4, the ashing rates of the polyimide films were measured respectively when the amount of the oxygen gas was 2.0 Pa·m³/s (1200 sccm), and 2.7 Pa·m³/s (1600 sccm). The uniformity and the ashing efficiency calculated from the measured ashing rates, respectively for the test example 2, the comparative example 3 and the comparative example 4 are described in Table 3 below.

TABLE 3

|  | Flow Rate of Oxygen Gas [sccm] | Average Ashing Rate of All Portions [nm/sec] | Average Ashing Rate of Portions Where Deposits Can Easily Occur [nm/sec] | Average Ashing Rate of Portions Likely To Be Worn [nm/sec] | Uniformity of Ashing Rates of All Portions [%] | Ashing Efficiency |
|---|---|---|---|---|---|---|
| Test Example 2 | 800 | 0.62 | 0.55 | 1.1 | 76 | 0.51 |
| Comparative Example 3 | 1200 | 0.81 | 0.76 | 1.4 | 84 | 0.53 |
| Comparative Example 4 | 1600 | 0.66 | 0.61 | 1.1 | 77 | 0.56 |

Moreover, as a test example 3, the ashing rates of the polyimide films were measured when the pressure in the chamber 10 was $2.7 \times 10^{-2}$ kPa (200 mTorr), and further, as a comparative example 5 and a comparative example 6, the ashing rates of the polyimide films were measured respectively when the pressure in the chamber 10 was $5.3 \times 10^{-2}$ kPa (400 mTorr), and $8.0 \times 10^{-2}$ kPa (600 mTorr). The uniformity and the ashing efficiency calculated from the measured ashing rates, respectively for the test example 3, the comparative example 5 and the comparative example 6 are described in Table 4 below.

TABLE 4

|  | Pressure in Chamber [mTorr] | Average Ashing Rate of All Portions [nm/sec] | Average Ashing Rate of Portions Where Deposits Can Easily Occur [nm/sec] | Average Ashing Rate of Portions Likely To Be Worn [nm/sec] | Uniformity of Ashing Rates of All Portions [%] | Ashing Efficiency |
|---|---|---|---|---|---|---|
| Test Example 3 | 200 | 0.66 | 0.66 | 1.1 | 72 | 0.61 |
| Comparative Example 5 | 400 | 0.6 | 0.49 | 1.1 | 82 | 0.45 |
| Comparative Example 6 | 600 | 0.84 | 0.78 | 1.5 | 84 | 0.53 |

Herein, in the WLDC (Wafer-less Dry Cleaning), to effectively suppress generation of the deposits, it is preferable that a large amount of deposits is ashed at the portions where the deposits can easily occur, and thus, it is preferable that the average ashing rate of the portions where the deposits can easily occur is large. To effectively prevent portions from being worn, it is preferable that the average ashing rate of the portions likely to be worn is small. That is, a condition having a large ashing efficiency is preferable for the WLDC. Further, ⌈the average ashing rate of all portions⌋ and ⌈the uniformity of the ashing rates of all portions⌋ in each Table are reference values to help for general understanding of the ashing rate in the chamber 10.

From the above-described viewpoint of improving the ashing efficiency, an investigation on the optimum condition of the WLDC, based on Tables, shows that $2.7 \times 10^{-2}$ kPa corresponding to the test example 3 is preferable as the pressure in the chamber 10 from Table 4. Further, from the viewpoint of the ashing efficiency, 500 W corresponding to the comparative example 1 is preferable as the optimum high frequency power from Table 2. On the other hand, this selection is not preferable as the optimum condition of the WLDC from the viewpoint of suppressing the wear because the average ashing rate of the portions likely to be worn is large (1.2 [nm/sec]) in this case. Accordingly, from the point of suppressing the wear, the investigation on the optimum condition of the WLDC shows that 300 W is preferable as the high frequency power from Table 2.

Further, from the viewpoint of the ashing efficiency, 2.7 Pa·m³/s corresponding to the comparative example 4 is preferable as the amount of the oxygen gas from Table 3. However, as there is no considerable difference among the ashing efficiencies of the test example 2, the comparative example 3 and the comparative example 4 in Table 3, as the amount of the oxygen gas, any one of those corresponding to the test example 2, the comparative example 3 and the comparative example 4 can be selected for the optimum condition of the WLDC. However, because the high frequency power of 300 W selected for the above-described optimum condition of the WLDC is low, it is preferable that the amount of the oxygen gas is chosen to be small from the viewpoint of efficiency in generating the plasma. Therefore, 1.4 Pa·m³/s corresponding to the test example 2 is preferable as the amount of the oxygen gas.

Figure 4:
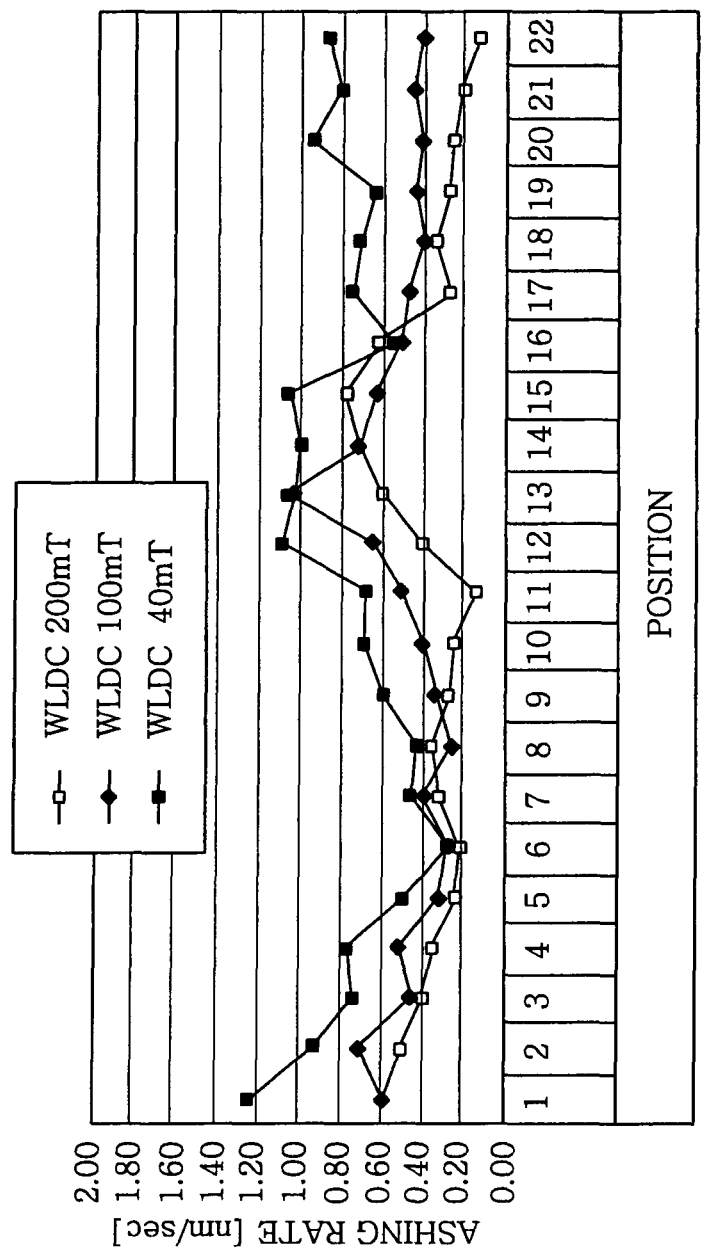
FIG. 4 depicts a graph for presenting ashing rate measurement results for cases in which pressures in the chamber are equal to or less than $2.7 \times 10^{-2}$ kPa, respectively.

Next, as described above, it is preferable that the pressure in the chamber 10 is low. Therefore, in each part of the inside of the chamber shown in FIG. 3, the ashing rate was measured to find an optimum pressure in the chamber 10 when the pressure in the chamber 10 was equal to or less than $2.7 \times 10^{-2}$ kPa (200 mTorr) under the condition that the flow rate of the oxygen gas introduced into the chamber 10 was 1.4 Pa·m³/s (800 sccm), and the high frequency power applied to the shower head was 300 W. The result is shown in FIG. 4. Further, the calculation results of the uniformity and the ashing efficiency derived from the measurement results of FIG. 4 are shown in FIG. 5.

Figure 5:
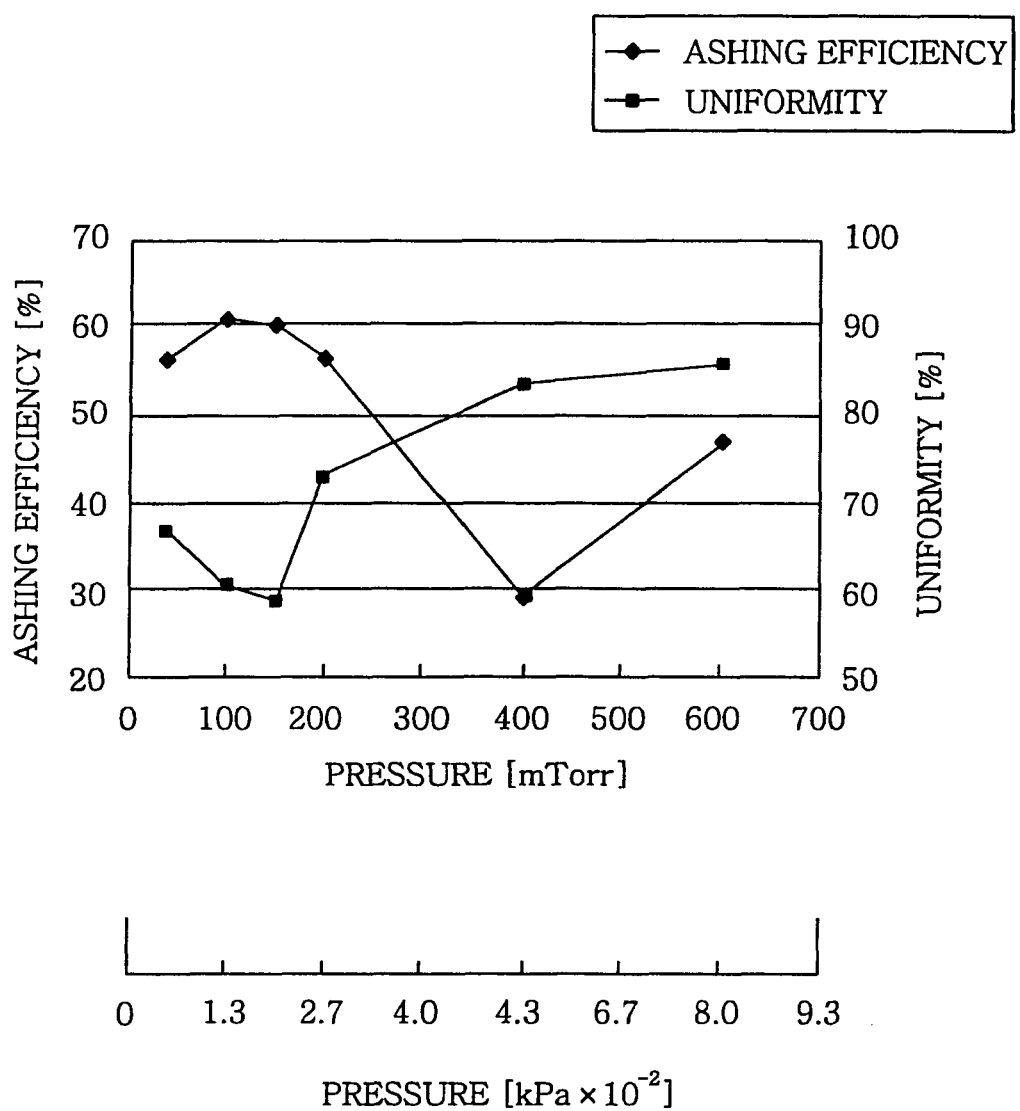
FIG. 5 presents a graph for presenting calculated uniformity and ashing efficiency obtained based on the measurement results shown in FIG. 4.

From the results of FIG. 5, it can be seen that the ashing efficiency is favorable when the pressure in the chamber 10 is in the range of $1.3 \times 10^{-2}$~$4.0 \times 10^{-2}$ kPa (100~300 mTorr). Therefore, it can be known that $1.3 \times 10^{-2}$~$4.0 \times 10^{-2}$ kPa is preferable as the pressure in the chamber 10.

From the results described above, as the optimum condition of the dry cleaning (WLDC), when the high frequency power applied to the shower head 33 is in the range of 200~400 W, the flow rate of the gas being introduced into the chamber 10 is equal to or greater than 1.4 Pa·m³/s (800 sccm), and the pressure in the chamber 10 is in the range of $1.3\times10^{-2}$~$4.0\times10^{-2}$ kPa (100~300 mTorr), more preferably, when the high frequency power applied to the shower head 33 is 300 W, and the flow rate of the oxygen gas introduced in the chamber 10 is 1.4 Pa·m$^3$/s, and the pressure in the chamber 10 is in the range of $1.3\times10^{-2}$~$2.7\times10^{-2}$ kPa, it can be known that the deposits can be removed without inflicting any damage on the parts in the processing chamber.

While the invention has been shown and described with respect to the preferred embodiment, it will be understood by those skilled in the art that various changes and modifications may be made without departing from the scope of the invention as defined in the following claims.

What is claimed is:

1. A plasma processing method, comprising the sequential steps of:

loading a target object into a processing chamber;

plasma processing the target object by using a plasma generated from a first gas introduced into the processing chamber under a first condition;

unloading the target object from the processing chamber;

performing, after unloading the target object, a particle removing process in which a second gas is introduced into the processing chamber under a second condition and particles, which are not removed from the processing chamber by the first gas, are removed from an inside of the processing chamber by discharging the second gas from the processing chamber;

introducing a third gas into the processing chamber;

generating a plasma of the third gas in the processing chamber;

removing deposits remaining in the processing chamber by using the plasma of the third gas; and discharging the third gas from the processing chamber, wherein the first condition is a product of a flow rate and a gas molecular weight of the first gas and the second condition is a product of a flow rate and a gas molecular weight of the second gas, wherein said performing the particle removing process is carried out prior to generating the plasma from the third gas and the flow rate of the second gas is controlled during the particle removing process such that a magnitude of the second condition is greater than that of the first condition to thereby remove the particles by a gas viscous force of the second gas, and wherein the second gas and the third gas each consist essentially of oxygen gas.

2. The plasma processing method of claim 1, wherein the magnitude of the second condition is greater than 1.05 times that of the first condition.

3. The plasma processing method of claim 1, wherein the flow rate of the second gas is set by adding 100 sccm to the flow rate of the first gas.

4. The plasma processing method of claim 1, wherein the first gas is identical to the second gas.

5. The plasma processing method of claim 1, wherein the first gas is different from the second gas.

* * * * *